United States Patent [19]

Itoh et al.

[11] 4,255,755

[45] Mar. 10, 1981

[54] HETEROSTRUCTURE SEMICONDUCTOR DEVICE HAVING A TOP LAYER ETCHED TO FORM A GROOVE TO ENABLE ELECTRICAL CONTACT WITH THE LOWER LAYER

[75] Inventors: Kunio Itoh; Morio Inoue, both of Takatsuki, Japan

[73] Assignee: Matsushita Electric Industrial Co., Ltd., Kadoma, Japan

[21] Appl. No.: 968,924

[22] Filed: Dec. 13, 1978

Related U.S. Application Data

[63] Continuation of Ser. No. 772,927, Feb. 28, 1977, abandoned, which is a continuation of Ser. No. 555,082, Mar. 4, 1975, abandoned.

[30] Foreign Application Priority Data

| Mar. 5, 1974 | [JP] | Japan | 49-25943 |
| Mar. 5, 1974 | [JP] | Japan | 49-25944 |
| Mar. 5, 1974 | [JP] | Japan | 49-25945 |
| Mar. 5, 1974 | [JP] | Japan | 49-25946 |

[51] Int. Cl.$^3$ ............... H01S 33/19; H01L 29/305; H01L 29/80; H01L 29/06
[52] U.S. Cl. ............................ 357/18; 357/16; 357/22; 357/55; 331/94.5 H
[58] Field of Search ................... 357/16, 18, 55; 331/94.5 H

[56] References Cited

U.S. PATENT DOCUMENTS

| 3,692,593 | 9/1972 | Hawrylo et al. | 148/172 |
| 3,700,978 | 10/1972 | North et al. | 357/58 |
| 3,740,661 | 6/1973 | D'Asaro | 357/18 |
| 3,780,359 | 12/1973 | Dumke et al. | 357/16 |
| 3,798,082 | 3/1974 | Schwartz | 357/64 |
| 3,801,391 | 4/1974 | Dyment et al. | 357/16 |
| 3,815,045 | 6/1974 | Ito | 357/18 |
| 3,833,435 | 9/1974 | Logan et al. | 357/16 |
| 3,836,988 | 9/1974 | Board | 357/3 |
| 3,920,491 | 11/1975 | Yonezu | 357/18 |
| 4,028,147 | 6/1977 | Kamath et al. | 357/18 |

FOREIGN PATENT DOCUMENTS

| 1088790 | 10/1967 | United Kingdom . |
| 1108027 | 3/1968 | United Kingdom . |
| 1341625 | 12/1973 | United Kingdom . |
| 1347874 | 2/1974 | United Kingdom . |

OTHER PUBLICATIONS

Dumke et al., "GaAs Field-Effect Transistors with Self-Register Gates", IBM Tech. Disclosure Bulletin, vol 14 (9/71), pp. 1248-1249.

Itoh et al., "New Heteroisolation Stripe-Geometry Visible-Light Emitting Lasers", IEEE J. Quantum Electronics, vol. QE-11 (7/75), pp. 421-426.

Tsang et al., "Lateral Current Confinement ... in GaAs-$Al_xGa_{1-x}As$DH Lasers", Applied Physics Letters, vol. 30 (5/77), pp. 538-540.

Teramoto, "New Structures Boost Semiconductor Laser Performance ...", Japan Electronic Engineering (3/75), pp. 32-37.

*Primary Examiner*—Gene M. Munson
*Attorney, Agent, or Firm*—Cushman, Darby & Cushman

[57] ABSTRACT

A semiconductor laser is made by sequential liquid-phase epitaxial growths on an n-type GaAs substrate, thereby sequentially forming
  a first layer of n-type GaAlAs,
  a second layer of n-type or p-type GaAs as active region,
  a third layer of p-type GaAlAs,
  said first to third layers forming a doublehetero structure,
  a fourth layer of p$^+$-type GaAs, and
  a fifth layer of n-type GaAlAs,
  by chemically etching the fifth layer, to form a groove or narrow window therein so as to expose a part of said fourth layer at the bottom of the groove, and
  by providing a metal electrode embedded in said groove.

In the laser of the abovementioned construction, the fifth layer, instead of the conventional oxide film, serves as an isolation layer. However, the fifth layer, being an epitaxially grown GaAlAs layer, has better thermal conductivity than an oxide film. Therefore, when a suitable heat-sink means or heat-radiation means is provided thereon, a laser of good heat radiation characteristics is obtainable, enabling production of higher power continuous wave laser.

The etching for forming the groove is easily made by chemically etching the desired layer by utilizing the difference in etching speed for different layers of hetero structure.

6 Claims, 9 Drawing Figures

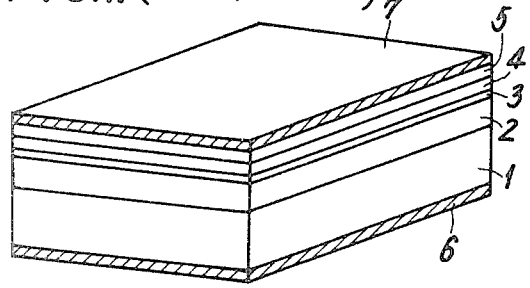
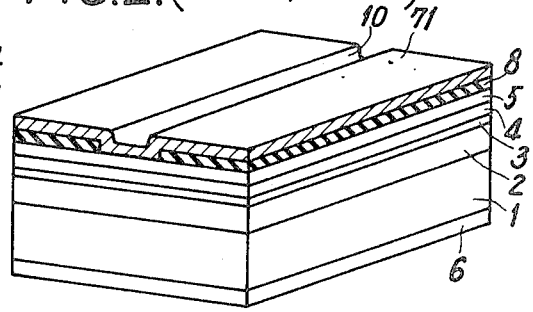
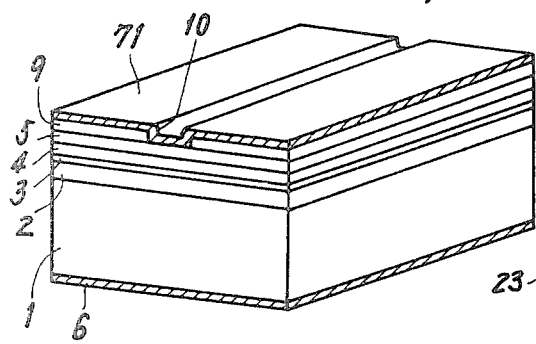
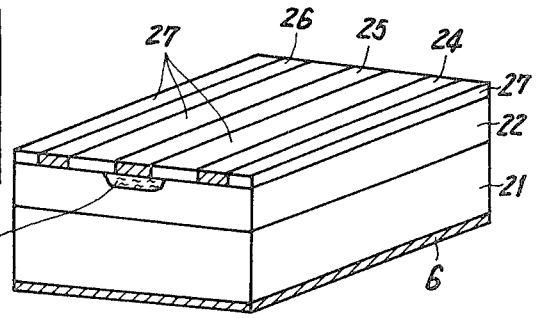
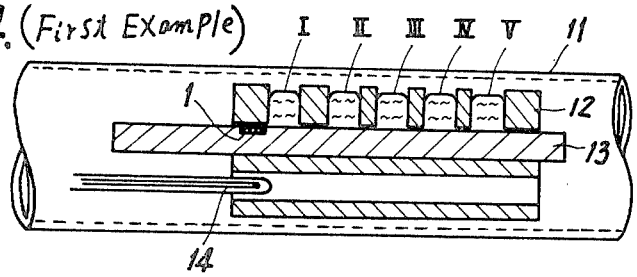
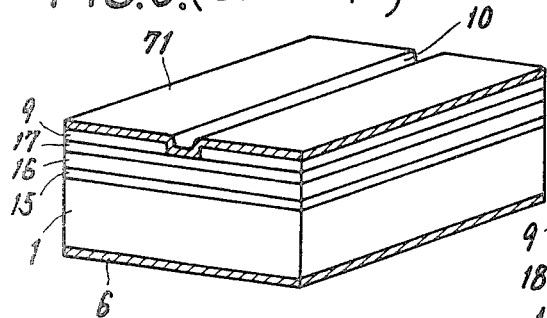
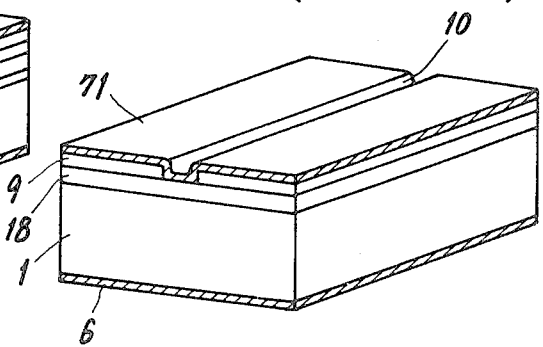

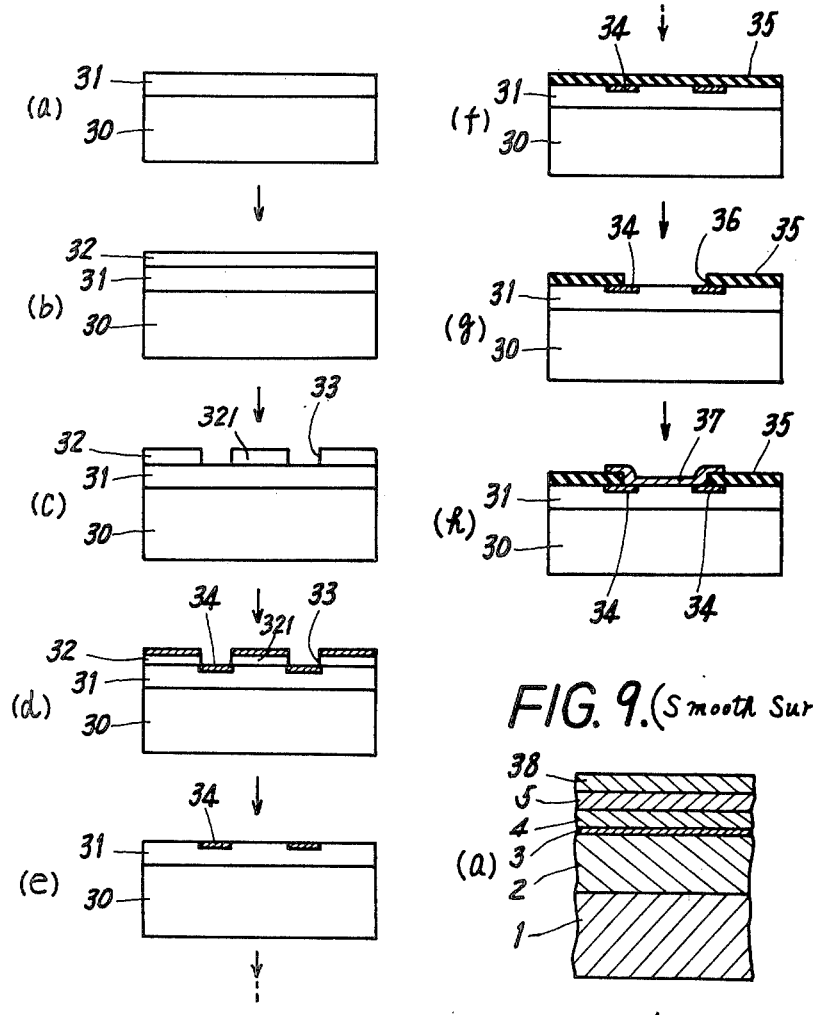
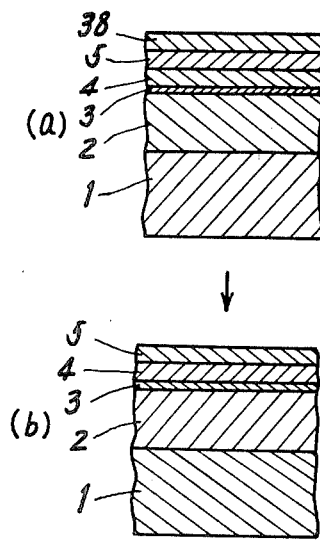

HETEROSTRUCTURE SEMICONDUCTOR DEVICE HAVING A TOP LAYER ETCHED TO FORM A GROOVE TO ENABLE ELECTRICAL CONTACT WITH THE LOWER LAYER

This is a continuation of application Ser. No. 772,927 filed Feb. 28, 1977, abandoned upon the filing hereof and which in turn was a continuation of Ser. No. 555,082 filed Mar. 4, 1975, now abandoned.

BACKGROUND OF THE INVENTION

This invention relates to light-emitting semiconductor devices, wherein carriers are injected across a junction into a region so that the light is emitted when the carriers recombine in the region, and relates to semiconductor devices having a schottky barrier with high breakdown voltage.

In a semiconductor device having a p-n junction, when a electric field is applied to allow a forward current to flow, minority carriers are injected across the junction, and when the minority carriers recombine with the majority carriers, as infrared or visible light is emitted. Such light-emitting phenomenon is utilized in a known light-emitting diode. Furthermore, by confining the emitted light as well as the carriers in a small limited region of a specified size, a light of a constant wavelength and of a coherent phase is amplified and can be taken outside. This is called the light-amplification by stimulated emission of radiation, or laser.

Recently, semiconductor lasers have made a remarkable progress, and especially, with the invention of the known doublehetero structure of semiconductor laser, the semiconductor lasers have entered into practical uses.

In the doublehetero structure, the emitted light as well as the injected carriers are confined in a thin layer or region which is substantially vertical to the direction of the current in the laser. By means of such confinement, the efficient lasing i.e., the laser oscillation, becomes realized.

As a typical example of the doublehetero structure laser, a laser constituted by sandwiching GaAs(gallium arsenic) layer, which is a semiconductor of III–V compound, with two GaAlAs (aluminum-gallium arsenic) layers is well known through, for instance, United States Patent specification No. 3,691,476 by Hayashi, Applied Physics Letters Aug. 1, 1970 vol. 17, No. 3, or Applied Physics Letters April 15, 1970, vol. 16, No. 8.

The abovementioned GaAlAs is, in exactness, $Ga_{1-x}Al_xAs$, which is a mixed crystal obtained by replacing a part of Ga of GaAs with Al, wherein the replaced ratio is indicated by $\times$ ($0 < \times \leqq 1$). Such layers of GaAs and GaAlAs are formed with known liquid-phase epitaxial growths.

Such semiconductor laser is very small in size, its active region where the current is concentrated being particularly small, and the current density, hence the heat loss, in the region is very great, and therefore, it is desirable to radiate this heat away. It is all the more important to effectively radiate the heat, since the more effective the radiation is, the higher the continuous wave power becomes possible.

It is also important in the semiconductor laser to effectively concentrate a current in the active region, hence to decrease threshold current, as well as to obtain single mode lasing in the laser. These are for obtaining laser light of high quality for use as a medium of information processing or in communication.

For clear understanding of the present invention, a typical doublehetero structure semiconductor laser of prior art is elucidated referring to FIG. 1 and FIG. 2.

The known laser of FIG. 1 is made by sequential liquid-phase epitaxial growths on an n-type GaAs substrate 1, thereby sequentially forming
 a first layer 2 of n-type $Ga_{1-x}Al_xAs$,
 a second layer 3 of p-type GaAs,
 a third layer 4 of p-type $Ga_{1-x}Al_xAs$,
 said first to third layers forming a doublehetero structure, and
 a fourth layer 5 of $p^+$-type GaAs, and
 further forming metal electrodes 6 and 7 for ohmic contactings to the bottom face of the n-type GaAs layer 1 and to the top face of the $p^+$-type GaAs layer 5, respectively.

The abovementioned laser of FIG. 1 works as a doublehetero structure laser wherein the p-type GaAs layer 3 is the active region sandwiched by n-type $Ga_{1-x}Al_xAs$ layer 2 and p-type $Ga_{1-x}Al_xAs$ layer 4, and both the carriers and the light are confined in the active region 3.

In such laser, the range of x in said $Ga_{1-x}Al_xAs$ is generally selected to be $0.25 < \times < 1.0$. The lower end of the range is defined by the following reasons:

Band gap and refractive index of the substance $Ga_{1-x}Al_xAs$ is dependent on the value x. And, for the value of $0.25 < \times$ the band gap of the $Ga_{1-x}Al_xAs$ becomes large enough to confine the injected carriers in the sandwiched GaAs layer, and also the refractive index of the $Ga_{1-x}Al_xAs$ becomes small enough to confine light in the active region 3 of GaAs.

In the laser of FIG. 1, the metal electrodes 6 and 7 are formed on all the bottom and top faces of the wafer, respectively, and therefore, the lasing output is large, but has a shortcoming that the threshold current becomes large and moreover the lasing mode becomes multiple.

In order to improve the abovementioned shortcoming, the known stripe-type semiconductor laser has been developed.

FIG. 2 shows a typical example of such known stripe-type laser, wherein a silicon-oxide insulating film 8 is provided on the fourth layer 5 of p-type GaAs and a stripe-shaped narrow window or groove 10 is formed in said insulating film 8 so as to expose a part of the fourth layer 5, and, further, a metal electrode 71, for instance, of gold, is provided on the wafer, so that the metal electrode 71 covers the insulating film 8 and the groove 10. Other parts are constituted similarly to the prior art of FIG. 1.

In the stripe-type laser of FIG. 2, the current is fed through a stripe-shaped part of the metal electrode, the part contacting the fourth layer 5 at the bottom of the groove 10. Accordingly, the current flows in through the narrow stripe part of the electrode and hence, the carrier is concentrated into the narrow region right under the groove. Therefore, an account of the abovementioned concentration, the threshold current is considerably decreased, and also the lasing mode can be made simple.

In the known stripe-type laser of FIG. 2, the silicon-oxide insulating film 8 which has poor heat conductivity is provided between the fourth layer 5 and the metal electrode 71. Therefore, the radiation of heat from the active region through the fourth layer 5, insulating film 8 and metal electrode 71 to upper outside space is very poor, and the temperature of the active region is raised. On account of the abovementioned poor heat radiation, it is difficult to obtain high lasing output at continuous wave operation. Furthermore, in the conventional laser of FIG. 2, thermal expansion coefficient of the forth layer 5 of GaAs and that of the insulating film 8 prominently differ from each other, and therefore, a considerable strain or defect is produced at the interface inbetween, and such strain or defect causes considerable adverse defect further in the active region, i.e., second layer 3. As a result of the defect in the active region 3, the lasing performance, especially of differential quantum efficiency is lowered and also the life of the laser device is shorten. In order to reduce such adverse effects of the defects to the active region, it is necessary to increase thickness of the fourth layer 5 of p-type GaAs. However, the increase of thickness of the fourth layer 5 causes dispersion of injection current in the widthwise direction of the groove 81, and accordingly causes the threshold current to increase, hence, poor heat radiation. Undesirable temperature rise due to the poor heat radiation disables the lasing of short wavelength light.

SUMMARY OF THE INVENTION

The first object of the present invention is to obtain semiconductor light-emitting devices having good heat-radiation characteristics, and good current concentration into the active region.

Another object of the present invention is to manufacture a double hetero-structure semiconductor laser having low threshold current and high output, capable of lasing visible light and having long life.

Further object of the present invention is to obtain an easy, efficient and stable manufacturing method of the doublehetero structure semiconductor laser.

A light-emitting device obtained according to the present invention has the structure that:

the light-emitting region is provided right under the stripe-shaped metal electrode covering a semiconductor wafer, the stripe-shaped metal electrode is narrow (for example, a few tens of micron wide) and is provided in the bottom of the groove, formed in an additional semiconductor layer on the upper face of the wafer, the additional layer forms an isolating junction, the groove extends to the upper face of the wafer so as to expose the wafer surface, and the metal electrode contacts the exposed upper face of the semiconductor wafer.

According to the abovementioned construction, the current flowing in the light-emitting region is well concentrated into a narrow region of a few tens of micron width, and furthermore, heat loss due to the current can be well conducted through the additional semiconductor layer to the metal electrode and be well radiated. Therefore, the aforementioned first and second objects are attainable.

The abovementioned additional layer is formed by liquid-phase epitaxial process in a manner that a hetero junction is formed between the additional layer and the uppermost layer which is immediately below the additional layer. The groove is made by chemically etching the additional layer by means of selective chemical etching process, and therefore, the third object, namely, easy, efficient and stable manufacture is attainable.

BRIEF DESCRIPTION OF THE INVENTION

FIG. 1 is a perspective view showing a doubleheterostructure semiconductor laser of prior art.

FIG. 2 is a perspective view of one example of doublehetero-structure semiconductor laser of stripe-electrode type of prior art.

FIG. 3 is a perspective view of one example of the doublehetero-structure semiconductor laser of stripe-electrode type according to the present invention.

FIG. 4 is a schematic sectional sideview of an apparatus for manufacturing the laser shown in FIG. 3.

FIG. 5 is a perspective view of an example of single-hetero-structure semiconductor laser of stripe-electrode type according to the present invention.

FIG. 6 is a perspective view of an example of homojunction structure semiconductor laser of stripe-electrode type according to the present invention.

FIG. 7 is a perspective view of one example of junction type field-effect transistor manufactured according to the process of the present invention.

FIG. 8 shows sectional sideviews of various steps of manufacture of a Schottky barrier diode according to the present invention.

FIG. 9 shows sectional sideviews of two steps of manufacture of a semiconductor crystal provided with very smooth principal face.

DETAILED DESCRIPTION OF THE INVENTION

One example of doublehetero-structure semiconductor laser of stripe-electrode type according to the present invention is elucidated referring to FIG. 3.

In the device of FIG. 3, on a substrate 1 of Te-doped n-type GaAs having Te-concentration of about $1 \times 10^{18}$ atoms/cm$^3$ and about 100$\mu$ thickness, a first layer 2 of n-type Ga$_{0.7}$Al$_{0.3}$As doped with Sn, having Sn-concentration of about $5 \times 10^{17}$ atoms/cm$^3$ and about 7$\mu$ thickness, a second layer 3 as active layer of n-type GaAs without dopant but having n-type conductivity due to intrinsic impurity of about $2 \times 10^{16}$ atoms/cm$^3$ concentration and 0.2$\mu$ thickness, a third layer 4 of p-type Ga$_{0.7}$Al$_{0.3}$As doped with Ge, having Ge-concentration of about $1 \times 10^{18}$ atoms/cm$^3$ and about 1$\mu$ thickness, and a fourth layer 5 of p$^+$-type GaAs doped with Ge, having Ge-concentration of about $1.5 \times 10^{18}$ atoms/cm$^3$ and about 0.5$\mu$ thickness are sequentially formed by known sequential liquid-phase epitaxial growth process.

And then, on the abovementioned fourth layer 5, a fifth layer or additional layer 9 of n-type Ga$_{0.7}$Al$_{0.3}$As doped with Sn, having Sn-concentration of about $5 \times 10^{17}$ atoms/cm$^3$ and 0.5$\mu$ thickness is formed also by sequential epitaxial process.

Next, a stripe-shaped groove or window 10 of about 30$\mu$ width is formed in the additional layer 9 so as to extend across the thickness of the additional layer 9 to reach the upper surface of the fourth layer 5. Accordingly, the stripe-shaped part of the upper face of the fourth layer 5 is exposed at the bottom of the groove 10 defining its bottom face. Then, a metal electrode 71 such as vapor deposited gold film is provided over the device, so that the metal electrode 71 formed in the stripe-shaped window 10 contacts the abovementioned exposed upper surface of the fourth layer 5 of p$^+$-type GaAs. Furthermore, second layer 3 can also be a ternary III–V crystal.

The abovementioned additionally formed n-type $Ga_{0.7}Al_{0.3}As$ layer 9 forms a hetero-junction against the underlying fourth layer 5 of $p^+$-type GaAs of ohmic conduction purpose, and the hetero-junction constitutes an isolating layer.

In the manufacture of the abovementioned device, the window 10 in the additional layer 9 can be made by means of the known photochemical etching process. Namely, the stripe part of the layer 9 is removed, retaining the exposed underlying fourth layer 5, by selectively etching away taking advantage of difference in etching speed between the layers 9 and 5. In such selective etching, by employing fluoric acid solution of 50 weight % or hydrochloric acid solution of 35 weight % as etchant, for the value y in a range of $0.2 \leq y < 1.0$, the stripe-shaped window 10 of the layer 9 of $Ga_{1-y}Al_yAs$ only, apart from the underlying fourth layer 5 of GaAs, can be selectively etched.

In a modified example, the third layer 4 and the fourth layer 5 can be combined in one layer, or the fourth layer 5 can be omitted.

FIG. 4 shows an apparatus for liquid-phase epitaxial growth process for manufacturing the device of FIG. 3. As shown in FIG. 4, in a quartz tube 11 is placed a graphite boat or container 12 and a substrate holder 13 of graphite, in a manner that the holder 13 holds the starting substrate 1, and the holder 13 is slid relative to the container 12, so that semiconductor solutions I, II, III, IV and V in the container 12 sequentially contact the substrate 1. The sequential epitaxial growths are made by inserting the system of FIG. 4 in a furnace (not shown), sliding the holder 13 against the container 12, and controlling the temperature of the furnace according to the known liquid-phase epitaxial growth method while detecting the temperature by a thermocouple 14 placed immediately under the substrate 1.

The semiconductor solutions in the container 12 are as follows

| Solution Number | Ga (g) | GaAs (mg) | Al (mg) | Dopant (mg) | Crystal | Thickness of grown layer (μ) | Numeral to designate formed layer |
|---|---|---|---|---|---|---|---|
| I | 1.0 | 50 | 2.3 | Sn 50 | $Ga_{0.7}Al_{0.3}As$ | 7.0 | 2 |
| II | 1.0 | 80 | 0 | none | GaAs | 0.2 | 3 |
| III | 1.0 | 50 | 2.3 | Ge 10 | $Ga_{0.7}Al_{0.3}As$ | 1.0 | 4 |
| IV | 1.0 | 80 | 0 | Ge 15 | GaAs | 0.5 | 5 |
| V | 1.0 | 50 | 2.3 | Sn 50 | $Ga_{0.7}Al_{0.3}As$ | 0.5 | 9 |

In the top layer, i.e., additional layer 9 of the wafer of about 100μ thickness formed in the foregoing process, a number of parallel stripe-shaped windows 10, 10, ... of 10μ width are formed with every 250μ gap inbetween. Then gold electrode layers 6 and 71 are vapor-deposited on both faces of the wafer, and then the wafer is cut into dice of 400μ long by 250μ wide. In each of the divided dice, a known heat sink made of diamond II (not shown) is bonded on the upper electrode 71.

In the semiconductor laser of the abovementioned structure, the heat produced in the active region under the fifth layer 9 of n-type $Ga_{0.7}Al_{0.3}As$ is effectively conducted to the heat sink and radiated, since there is no heat-impeding substrate such as oxide layer as in prior art. Therefore, the lasing wavelength extends as short as 7610 A in visible light range at coutinuous-wave operation using $Ga_{0.78}A_{0.22}As$ as a material of the active region, and for pulsive lasing, the wavelength further extends to 6680 A, using $Ga_{0.65}Al_{0.35}As$ as a material of the active region.

In the semiconductor laser of the present invention, since the $Ga_{0.7}Al_{0.3}As$ layer 9 is epitaxiall grown on the fourth layer 5, the thickness of the fourth layer 5 of $p^+$-type GaAs can be made as small as practicable. Accordingly, the distance from the electrode 71 to the active region 3 of p-type GaAs is reduced, and hence, dispersion of the injected current laterally from the stripe-shaped electrode is minimized, and therefore, the threshold current is considerably lowered.

Laser of this invention has a further advantage that, due to the close matching of lattice constants and thermal expanding coefficient between the fourth layer 5 of GaAs and the additional fifth layer of $Ga_{0.7}Al_{0.3}As$, there is very few possibility of forming lattice imperfection and defect at the interface of layers in the semiconductor crystal. Therefore, the adverse defect in the active region is decreased by one order in comparison with conventional stripe-type laser with oxide insulating film, and hence, life of the laser is considerably improved.

FIG. 5 shows a singlehetero-structure laser of stripe-type embodying the present invention. In this device, on a substrate 1 of n-type GaAs doped with Te, having Te-concentration of about $1 \times 10^{18}$ atoms/cm$^3$ and about 100μ thickness, a first layer 15 as active layer of p-type GaAs doped with Zn having Zn-concentration of about $2 \times 10^{19}$ atom/cm$^3$ and 2μ thickness, thickness, a second layer 16 of $p^+$-type $Ga_{0.7}Al_{0.3}As$ doped with Zn, having Zn concentration of about $2 \times 10^{19}$ atoms/cm$^3$ and about 1μ thickness, and a third layer 17 of p-type GaAs doped with Ge, having Ge-concentration of about $1.5 \times 10^{18}$ atoms/cm$^3$ and about 0.5μ thickness are formed by known sequential liquid-phase epitaxial growth process. And then, on the abovementioned third layer 17, a fourth layer or additional layer 9 of n-type $Ga_{0.7}Al_{0.3}As$ doped with Sn, having Sn-concentration of about $5 \times 10^{17}$ atoms/cm$^3$ and 0.5μ thickness is formed also by sequential epitaxial process. And then, similarly to the manufacturing of the device shown in FIG. 3 and FIG. 4, a stripe-shaped window 10 is formed in the layer 9, and a metal electrode 71 is formed to cover the layer 9 and the window 10.

According to the same reasons for the previous example shown in FIG. 3 and FIG. 4, the device of FIG. 5 has advantages of improved heat radiation hence, improved smaller threshold current, in comparison with conventional singlehetero-structure laser of stripe-type.

FIG. 6 shows a homo-junction structure laser of stripe-type embodying the present invention. In this device, on a substrate 1 of n-type GaAs doped with Te, having Te concentration of about $1 \times 10^{18}$ atoms/cm$^3$ and about 100μ thickness, a first layer 18 is active layer of p-type GaAs doped with Zn having Zn-concentration of about $2 \times 10^{19}$ atoms/cm$^3$ and $2\mu$ thickness, and a second layer 9 of n-type Ga$_{0.7}$Al$_{0.3}$As doped with Sn, having Sn-concentration of about $5 \times 10^{17}$ atoms/cm$^3$ and $0.5\mu$ thickness are formed by a known sequential liquid-phase epitaxial growth process. And then, similarly to the manufacturing of the device shown in FIG. 3 and FIG. 4, a stripe-shaped window 10 is formed in the layer 9, and a metal electrode 71 is formed to cover the layer 9 and the window 10.

According to the same reason for the previous example shown in FIG. 3 and FIG. 4, the device of FIG. 6 has advantages of improved heat radiation, hence, smaller threshold current in comparison with conventional homo-structure laser of stripe-type.

In the devices of the previous examples of FIG. 3, FIG. 5 and FIG. 6, the additional i.e., uppermost epitaxially grown layer 9 of n-type Ga$_{1-y}$Al$_y$As forms a hetero-junction between the immediately underlying p-type GaAs layer. The abovementioned last grown layer 9 can be replaced by an insulating GaAs having high specific resistance of over $10^3$ $\Omega$cm, preferable between $10^4$–$10^6$ $\Omega$cm, or an n-type GaAs. Such modified species also has advantages of improved heat radiation and improved lattice perfection, hence, larger output and smaller threshold current in comparison with conventional devices.

FIG. 7 shows one example of a junction-type field-effect transistor (commonly called FET) manufactured by the epitaxial growth method of the present invention. In this device, on a substrate 21 of p-type GaAs of $100\mu$ thickness, an n-type GaAs layer 22 of $3\mu$ thickness and further, a temporary isolating (not shown) of $1\mu$ thick n-type Ga$_{0.7}$Al$_{0.3}$As are formed by sequential liquid-phase epitaxial growth process.

Then, in the temporary isolating layer, a stripe-shaped window of $30\mu$ width is formed by a known selective etching process taking advantage of difference in etching speeds of the isolating layer and the underlying layer 22, so that upper surface of the underlying layer 22 is exposed from the window. Next, an acceptor dopant such as Zn is diffused into the underlying n-type GaAs layer 22 through the window, so as to form diffused region 23 having $0.2\mu$ deep diffusion front. Then the n-type Ga$_{0.7}$Al$_{0.3}$As temporary isolation layer is removed by dissolving by fluoric acid etchant or by hydrochloric acid etchant, and thereafter, an insulating layer 27 of $1\mu$ thick GaAs having specific resistivity of over $10^3$ $\Omega$cm, preferably $10^4$ $\Omega$cm to $10^6$ $\Omega$cm, is provided on the wafer by vapor-phase chemical deposition process. Three parallel stripe-shaped windows are formed in the last provided permanent insulating layer 27, in a manner that central window is formed on the diffused region 23 so as to expose it. Lastly, metal electrodes 24, 25 and 26 are vapor-deposited in the windows, to constitute source, gate and drain electrode.

The abovementioned isolation layer 27 can be Ga$_{1-y}$Al$_y$As of high specific resistivity of over $10^3$ $\Omega$cm or preferably $10^4$ to $10^6$ $\Omega$cm, instead of the abovementioned insulating GaAs, thereby forming a hetero-structure with the underlying n-type GaAs layer 22.

In the field-effect transistor of FIG. 7, the isolation layer 27 on the top face forms a junction structure against the underlying layer 22, in which junction structure the lattice constant as well as thermal expansion coefficient matches closely, and therefore, there is very low possibility of defect at the isolating junction, and hence, the device has a sufficient stability.

FIG. 8 shows a flow chart of making a Schottky barrier diode. This making method utilizes the difference in etching rate between the layers of hetero structure and the good crystal bonding characteristic of hetero structure, and utilizes the epitaxially grown top layer as a diffusion mask.

On an n$^+$-type GaAs substrate 30 of about $100\mu$ thickness, an n-type GaAs layer 31 having donor concentration of $1 \times 10^{17}$ atoms/cm$^3$ and $2\mu$ thickness is formed as shown in FIG. 8($a$) by epitaxial grown process, and an n-type Ga$_{0.5}$Al$_{0.5}$As layer 32 having donor concentration of $1 \times 10^{16}$ atoms/cm$^3$ and $1\mu$ thickness is formed as shown in FIG. 8($b$) by epitaxial growth process. Then, utilizing fluoric acid of 50 weight % as etchant, a ring-shaped window 33 is formed in the upper layer 32 so as to expose the ring part of upper face of the middle layer 31, retaining a central round island 321 of $10\mu$ diameter in the ring window 33, as shown in FIG. 8($c$). Then Zn is diffused from a diffusion source of ZnAs$_2$ into the principal face of the wafer so as to form diffusion front at $0.2\mu$ depth. The diffusion is made in a quartz tube at the temperature of 750° C. for 5 minutes. By the abovementioned diffusion, a ring-shaped p$^+$-type diffused region 34 is formed in the n-type GaAs layer 31 as shown in FIG. 8($d$). In the diffusion process, the Ga$_{0.5}$Al$_{0.5}$As layer 32 with ring-shaped window 33 serves as a diffusion mask. Then the abovementioned layer 32 used as the mask is removed by selective etching with the fluoric acid etchant, to expose the principal face of the wafer as shown in FIG. 8($e$). Next, by a known chemicl vapor-deposition process, a silicon oxide film 35 of $0.5\mu$ thickness is formed on the principal face, as shown in FIG. 8($f$). Then, a round opening 36 of $15\mu$ diameter is formed in the silicon oxide film 35 by a known photochemical etching process, in a manner that the principal face of the n-type GaAs layer 31 is exposed in the opening 36, and the brim of the round opening 36 lies halfway on the ring-shaped p$^+$-type diffused region 34, as shown in FIG. 8($g$). Finally, a Schottky barrier electrode of molybdenum film 37 is formed to cover the opening 36 and a brim part of the silicon oxide film 35 which is defining the opening 36, as shown in FIG. 8($h$).

In the abovementioned Schottky diode, the Schottky barrier is formed between the n-type GaAs layer 31 and the molybdenum film 37, and the diffused p$^+$-type region 34 serves as a surface-charge cutting band or a guard ring, which gives an improved sharp characteristic of reverse breakdown current. The abovementioned improvement is obtained by the facts that the n-type layer 32 of Ga$_{0.5}$Al$_{0.5}$As once used as the diffusion mask has close matching of lattice constant, hence good bonding, to the n-type grown layer 31 of GaAs, resulting in little defect in the layer 31, hence little lateral diffusion which has been an adverse phenomenon to be eliminated, and that a very smooth principal face of the n-type GaAs layer 31 is obtainable when the n-type Ga$_{0.5}$Al$_{0.5}$As layer 32 is removed by etching.

FIG. 9 is a flow chart of manufacture process of a semiconductor wafer by liquid-phase epitaxial growth, which process is capable of making a very smooth principal face and a well controlled thin uppermost growth layer. Such smooth uppermost layer is desirable in the laser structure for bonding a heat sink thereto.

As shown in FIG. 9($a$), on a substrate 1 of n-type GaAs, are sequentially formed by liquid-phase epitaxial growth method a first layer 2 of n-type Ga$_{0.7}$Al$_{0.3}$As, a second layer 3 of p-type GaAs, a third layer 4 of p-type $Ga_{0.7}Al_{0.3}As$, a fourth layer 5 of p$^+$-type GaAs and an additional layer 38 of p-type $Ga_{0.7}Al_{0.3}As$ as shown in FIG. 9(b). The epitaxial growth can be made by utilizing the liquid-phase epitaxial growth apparatus as elucidated referring to FIG. 4.

Then, the last grown uppermost layer 38 of p-type $Ga_{0.7}Al_{0.3}As$ is removed by chemical etching with fluoric acid or hydrochloric acid. As a result of the etching, on the principal face of the crystal wafer, the fourth layer 5 of p$^+$-type GaAs is exposed as a very smooth mirror plane. The mirror plane thus obtained has very little defect, since the temporary fifth layer 38 and the underlying fourth layer 5 have close matching in lattice constant and thermal expansion coefficient. Due to very little defect in the uppermost retained layer 5, the layers 5 and 4 can be made thin, and therefore, good heat radiation is obtainable.

The method of FIG. 9 is also applicable to any semiconductor device wherein the uppermost additional layer 38 and the underlying layer have close characteristic in lattice constant and in thermal expansion coefficient and have a suitable etchant for selectively removing the uppermost additional layer 38 only, while retaining the underlying layer 5. No matter what combination of the layers 38 and 5 is, for instance, a hetero-structure combination of GaP and $GaAs_{1-n}P_n$ where $0 < n \leq 1$, GaAS and $GaAs_{1-n}P_n$ or GaAs and $Ga_{1-n}In_nAs$, this applies.

The abovementioned method of obtaining a mirror plane on a semiconductor wafer is characterized in that:

in a liquid-phase epitaxial growth of a single crystal layer (5) on a substrate (1) of a single crystal, the method comprising the steps of:

further growing the other single crystal layer (38) on the former layer (5), said other layer (38) being different in etching characteristic from said former layer (5) so as to be selectively removed from said former layer (5) by etching but can be grown in sequential epitaxial growth on said former layer (5), and removing by selectively etching said other layer (38) to expose the surface of said former layer (5).

The abovementioned method is also applicable to the hetero-structure combination of semiconductor crystal of group IV and a suitable semiconductor mixed crystal of III-V compound. Examples of such combination are as follows:

Ge and $GaAs_{1-m}P_m$, ($0 \leq m < 0.4$)     (1)

Si and $GaAs_{1-q}P_q$, ($0.6 < q \leq 1.0$).     (2)

What is claimed is:

1. A heterostructure multi-layer semiconductor device comprising:
   an epitaxially grown uppermost semiconductor crystal layer of a given material having one conductivity type;
   an underlying semiconductor crystal layer of different material lying immediately under said uppermost crystal layer and having a conductivity type opposite to that of said uppermost layer;
   said uppermost semiconductor crystal layer and said underlying semiconductor crystal layer being epitaxially grown and forming a p-n heterojunction therebetween for electrical isolation;
   said uppermost semiconductor crystal layer having at least one chemically etched stripe-shaped groove which exposes a part of the upper face of said underlying semiconductor crystal layer; and
   a metal electrode formed onto the surface of said underlying semiconductor layer exposed by said at least one chemically etched groove in said uppermost semiconductor crystal layer, said metal electrode contacting and extending over the surface of said uppermost semiconductor crystal layer.

2. The semiconductor device of claim 1 wherein:
   said device further comprises a binary III-V crystal substrate and a light emitting layer, said light emitting layer being an epitaxial growth region formed on said substrate;
   said underlying semiconductor crystal layer is an epitaxial growth layer formed on said light emitting layer; and
   said uppermost semiconductor crystal layer is a ternary III-V crystal formed by replacing a portion of the Ga in GaAs with Al.

3. The semiconductor device of claim 1 wherein:
   said device further comprises a substrate of GaAs crystal, a light emitting layer, said light emitting layer being an epitaxial growth region formed on said substrate, an epitaxial growth layer of ternary III-V crystal formed on said light emitting layer;
   said underlying semiconductor crystal layer being formed on said epitaxial growth layer; and
   said uppermost semiconductor crystal layer being a GaAlAs crystal.

4. A semiconductor laser having a double heterostructure comprising:
   a substrate of binary III-V crystal;
   a first epitaxial growth layer of ternary III-V crystal formed on said substrate;
   a second epitaxial growth layer formed on said first growth layer including at least an active region formed of a material from the group consisting of a binary III-V crystal and ternary III-V crystal;
   a third epitaxial growth layer formed on said second epitaxial growth layer and having one conductivity type;
   an uppermost epitaxial growth layer formed on said third epitaxial growth layer and having a conductivity type different from that of said third epitaxial growth layer and being electrically isolated from said third epitaxial growth layer by an isolation junction formed therebetween, and having a stripe-shaped groove which exposes said third epitaxial growth layer therethrough;
   said third epitaxial growth layer and said uppermost epitaxial growth layer being: a binary III-V crystal and a ternary III-V crystal, respectively:
   a metal electrode formed on the surface of said third epitaxial growth layer exposed by said stripe-shaped groove, said metal electrode contacting extending over the upper surface of said uppermost growth layer.

5. The semiconductor device of claim 4 wherein:
   said second epitaxial growth layer includes an additional epitaxial growth layer of a ternary III-V crystal formed on said active region.

6. A semiconductor laser having a double heterostructure comprising:
   a substrate of binary III-V crystal;
   a first epitaxial growth layer formed on said substrate of a ternary III-V crystal;
   a second epitaxial growth layer formed on said first epitaxial growth layer as an active region, said second epitaxial growth layer from the group consisting of a binary III-V crystal and a ternary III-V crystal;

a third epitaxial growth layer of a ternary III-V crystal formed on said second epitaxial growth layer;

a fourth epitaxial growth layer formed on said third epitaxial growth layer of a binary III-V crystal having one conductivity type;

an uppermost epitaxial growth layer formed on said fourth epitaxial growth layer, said uppermost epitaxial growth layer being a ternary III-V crystal and having a conductivity type different from that of said fourth epitaxial growth layer and being electrically isolated from said fourth epitaxial growth layer by an isolation junction formed therebetween, and having a stripe-shaped groove which exposes said fourth epitaxial growth layer therethrough; and a metal electrode formed onto the surface of said fourth epitaxial growth layer exposed by said stripe-shaped groove, said metal electrode contacting and extending over the upper surface of said uppermost semiconductor crystal layer.

* * * * *